(12) United States Patent
Deboy et al.

(10) Patent No.: US 6,271,562 B1
(45) Date of Patent: Aug. 7, 2001

(54) SEMICONDUCTOR COMPONENT WHICH CAN BE CONTROLLED BY A FIELD EFFECT

(75) Inventors: Gerald Deboy, Unterhaching; Jens-Peer Stengl, Grafrath; Jenoe Tihanyi, Kirchheim, all of (DE); Heimo Graf, Paternion (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/259,636

(22) Filed: Mar. 1, 1999

(30) Foreign Application Priority Data

Feb. 27, 1998 (DE) .............................................. 198 08 348

(51) Int. Cl.[7] .................................................. H01L 29/76
(52) U.S. Cl. ........................................... 257/341; 257/328
(58) Field of Search ................................. 257/341, 342, 257/330, 331, 328, 170

(56) References Cited

U.S. PATENT DOCUMENTS

| | | | |
|---|---|---|---|
| 4,639,762 | * 1/1987 | Neilson et al. | 257/142 |
| 4,754,310 | 6/1988 | Coe | 257/287 |
| 5,008,725 | 4/1991 | Lidow et al. | 257/341 |
| 5,057,884 | * 10/1991 | Suzuki et al. | 257/144 |
| 5,095,343 | 3/1992 | Klodzinski et al. | 257/328 |
| 5,338,693 | 8/1994 | Kinzer et al. | 438/268 |
| 5,438,215 | * 8/1995 | Tihanyi | 257/401 |
| 5,475,252 | * 12/1995 | Merrill et al. | 257/341 |
| 5,654,562 | * 8/1997 | Fragale et al. | 257/164 |
| 5,753,942 | * 5/1998 | Seok | 257/133 |
| 5,981,998 | * 11/1999 | Frisina et al. | 257/339 |
| 6,060,747 | * 5/2000 | Okumura et al. | 257/331 |
| 6,072,214 | * 6/2000 | Herzer et al. | 257/331 |

FOREIGN PATENT DOCUMENTS 0 098 497 A2  1/1984  (EP) .
0 199293 A2  10/1986  (EP) .

OTHER PUBLICATIONS

International Patent Application WO 97/29518 (Tihanyi et al.), dated Aug. 14, 1997.
Published International Application No. 97/29518 (Tihanyi et al.), dated Aug. 14, 1997.

* cited by examiner

Primary Examiner—Tom Thomas
Assistant Examiner—Shouxiang Hu
(74) Attorney, Agent, or Firm—Hebert L. Lerner; Laurence A. Greenberg; Werner H. Stemer

(57) ABSTRACT

A power semiconductor component that can be controlled by a field effect has a multiplicity of parallel-connected individual components disposed in cells, the cells are disposed tightly packed on a relatively small space in a cell array. Parallel-connected source zones of the cells have shadowed regions that in each case reduce an effective W/L channel ratio in the cells containing the shadowed regions. The invention has the advantage that because of the provision of the shadowed regions inside the source zones that are preferably undoped or at least much weaker than the source zones, the critical regions in the cell array with the highest current density are specifically moderated. Thus the current density in the current-carrying filament of the cell is more homogeneously distributed. This measure renders it possible to reduce the cell grid spacing of the cells in the cell array, or to reduce the forward resistance per unit area, and this leads simultaneously to a reduction in the power loss.

15 Claims, 5 Drawing Sheets

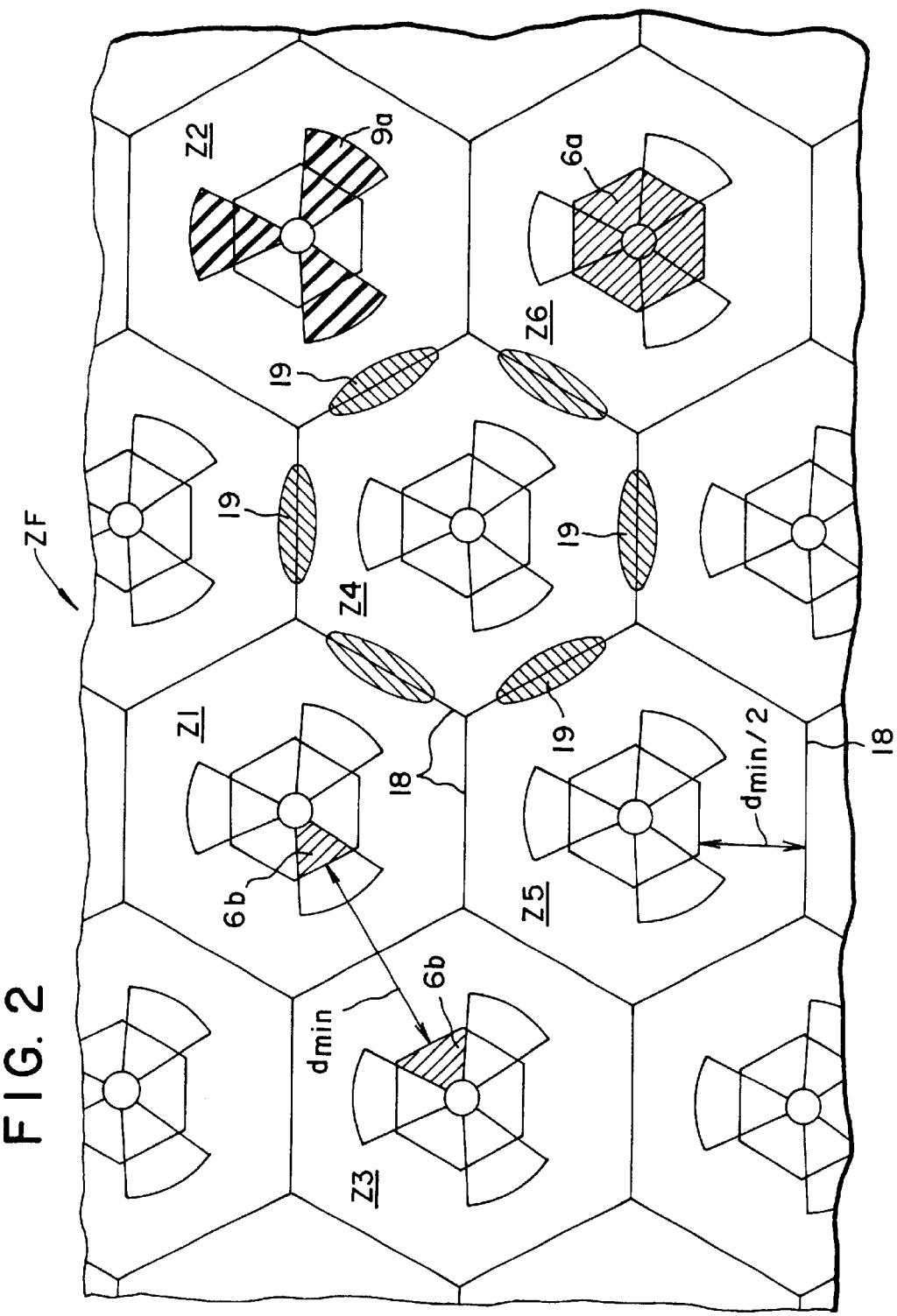

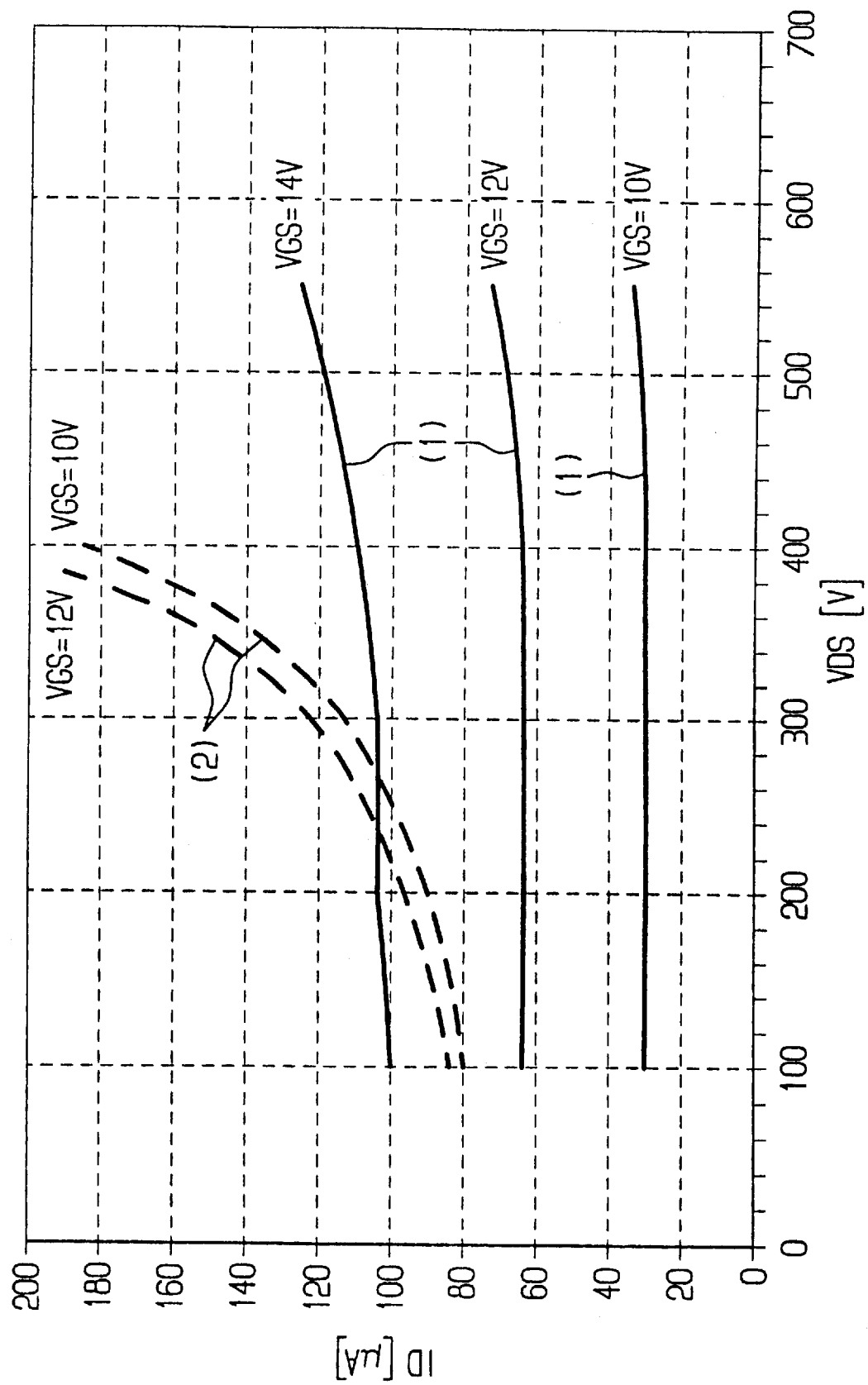

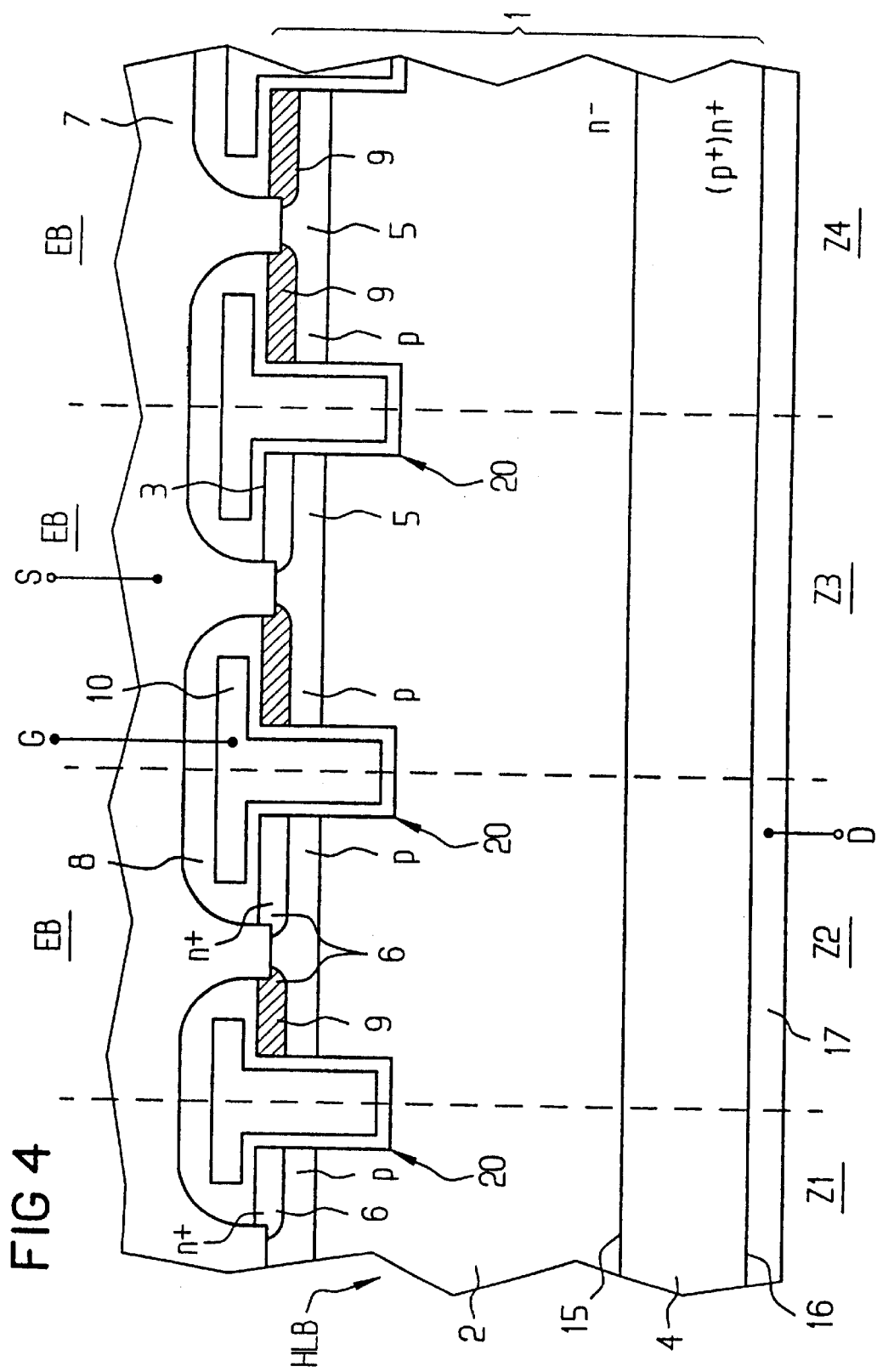

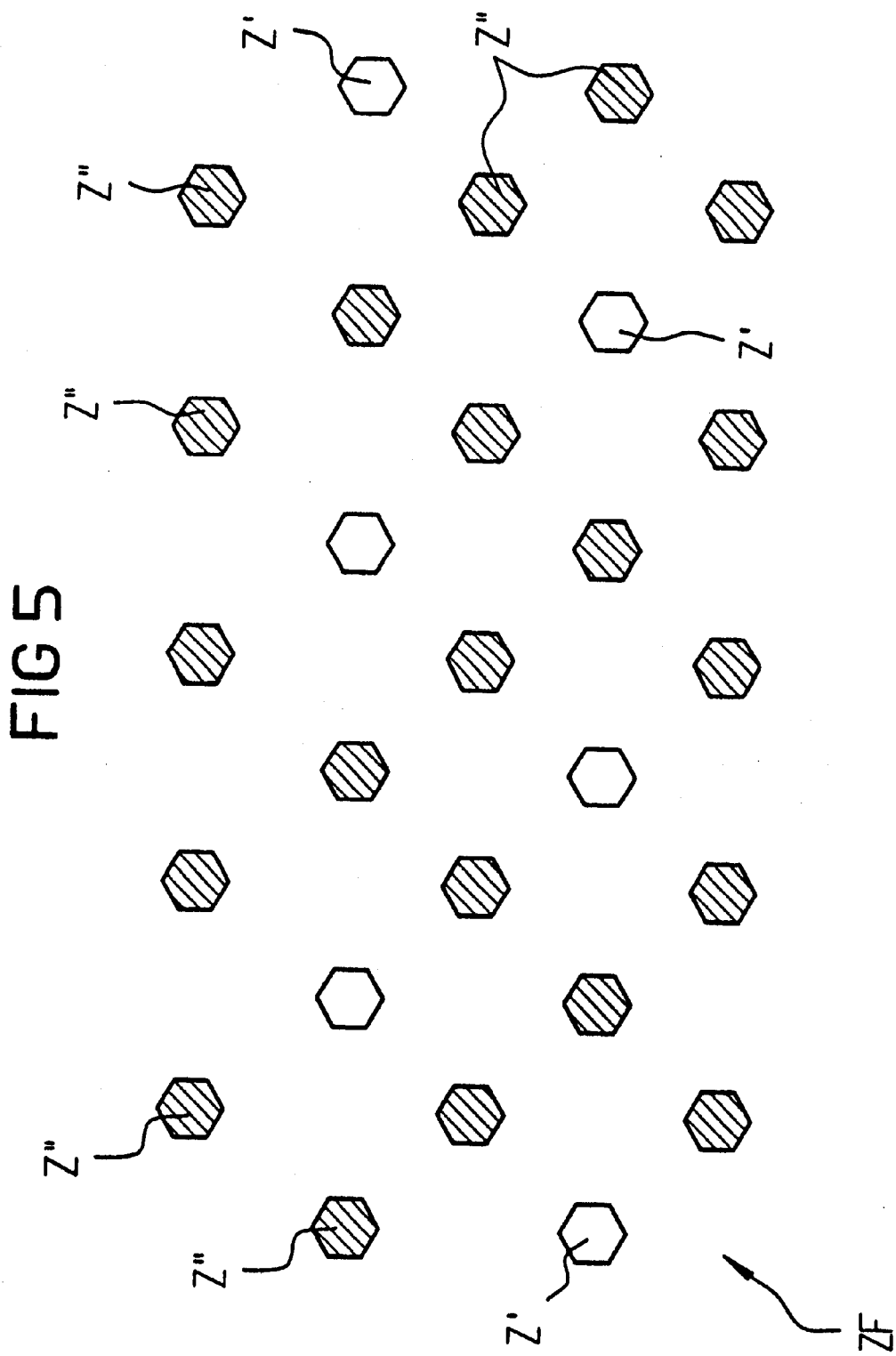

SEMICONDUCTOR COMPONENT WHICH CAN BE CONTROLLED BY A FIELD EFFECT

BACKGROUND OF THE INVENTION

FIELD OF THE INVENTION

The invention relates to a power semiconductor component that can be controlled by a field effect and has a multiplicity of parallel-connected individual components disposed in each case in cells. The cells are disposed tightly packed on a relatively small space in a cell array. The cell array includes a semiconductor body, having:

a) at least one inner zone of a first conductivity type, which borders at least partially on a first surface of the semiconductor body;
b) at least one drain zone which borders on the inner zone,
c) at least one base zone embedded in the semiconductor body on the first surface and having a second conductivity type;
d) at least one source zone embedded in the base zones and having the first conductivity type;
e) at least one source electrode which in each case makes contact with the base zones and the source zones embedded therein; and
f) at least one gate electrode insulated against the entire semiconductor body.

Such semiconductor components that can be controlled by a field effect have long been part of the prior art. On the one hand, they are known as MOS field effect transistors to the extent that the drain zone bordering on the inner zone is of the same conductivity type as the inner zone. On the other hand, such semiconductor components which can be controlled by a field effect are known as insulated gate bi-polar transistors (IGBTs) to the extent that the drain zone is constructed as an anode zone and is of the opposite conductivity type to the inner zone.

Such vertical MOSFETs or IGBTs are described in detail in Jens Peer Stengl, Jenoe Tihanyi, Leistungs-MOSFET-Praxis [Power MOSFET Praxis], 2nd Edition, Pflaum-Verlag, Munich, 1992.

U.S. Pat. No. 5,008,725 discloses a generic semiconductor component in which a multiplicity of parallel-connected individual components which are disposed in each case in cells and are disposed tightly packed in a cell array.

Inherent in all the semiconductor components mentioned at the beginning is the disadvantage that the forward resistance per unit area $RDS_{on}$, that is to say the resistance between a drain terminal and source terminal in the turned-on state, increases with the increasing voltage endurance of the semiconductor component. The reason for this is the thickness of the inner zone, which is also designated as the drift zone in power semiconductor components and which essentially determines the voltage endurance. When a reverse voltage is applied, the drift zone takes up the reverse voltage and thus prevents undesired switching-through in the reverse direction. The thickness of the drift zone is thus approximately proportional to the reverse voltage which can be taken up by the drift zone, and thus to the voltage endurance of the power semiconductor component. In the case of vertically constructed power MOSFETs, the forward resistance per unit area $RDS_{on}$ is usually approximately 12 $\Omega mm^2$ for a voltage of 600 V.

It is therefore necessary for doping-structured bulk regions to be introduced into the drift zone of such semiconductor components in order to reduce the forward resistance per unit area. Semiconductor components with doping-structured bulk regions in the drift zone are described in detail in International Patent Application WO 97/29518 and in U.S. Pat. No. 4,754,310. Technology described there permits a substantial reduction in the forward resistance per unit area. By reducing the chip area, it is possible to produce very cost-effective components in conjunction with a forward resistance $RDS_{on}$ per unit area that is the same or better.

However, as a consequence of introducing additional charge carriers of the opposite conductivity type into the drift zone, a substantially smaller portion of the active chip area (typically 60%) is available for transporting the load current. In addition, as a consequence of the high voltage take-up of the semiconductor component and of the doping-structured bulk regions prescribed by the technology, a very high electric transverse field, which leads to an additional constriction of the active chip area participating in the current flow, is built up in the saturation region of the characteristic diagram which is traversed, for example, upon switching inductive loads in short-circuit operation. The current density in this current filament reaches values in the range of a few kA $cm^{-2}$ as a result of this. If the electron concentration necessary for the forward current reaches the region of the basic doping of the drift zone, the electric vertical field likewise rises steeply, the characteristic of its field distribution rising as a function of the depth. However, the reverse voltage of the semiconductor component drops as a result, and charge carriers are generated by impact ionization.

As a result of this, a critical current density $J_{crit}$ is defined which specifies the maximum permissible current density in the drift zone, and for which the electric vertical field is still negligibly small. The critical current density $J_{crit}$ is defined as follows in this case:

$$J_{crit} \leq xqN_D v_{Sat}$$

Here, q denotes the elementary charge, $N_D$ the doping concentration in the drift zone, and $v_{Sat}$ the saturation drift velocity (typically 107 cm $sec^{-1}$). X specifies a so-called reduction factor whose value is between 0 and 1. Typically, the user selects a reduction factor x between 0.1 and 0.2 depending on application.

In order to avoid the critical current density from being reached, relatively large cell grid spacings are used in the technology currently employed for power semiconductor components, in particular power MOSFETS, because of the absolutely dominant epitaxial component in the total forward resistance of the semiconductor component. In the case of a MOSFET configured for a reverse voltage of 600 V, the epitaxial component is, for example, approximately 99% of the forward resistance. For such a MOSFET, the individual cells can have a relatively large cell grid spacing of $L_R \geq 40$ $\mu m$. However, with individual cells which are so large it is the case, on the one hand, that the channel width per cell area used is relatively slight. On the other hand, as a consequence of the limitation of the maximum permissible power loss, the high total forward resistance of the MOSFET permits only a relatively low forward current of typically 6 to 8 A.

SUMMARY OF THE INVENTION

It is accordingly an object of the invention to provide a semiconductor component which can be controlled by a field effect that overcomes the above-mentioned disadvantages of the prior art devices of this general type, which can be controlled by a field effect in such a way that despite a high reverse voltage, a low forward resistance is achieved and the disadvantages indicated in the prior art are eliminated.

With the foregoing and other objects in view there is provided, in accordance with the invention, an improved power semiconductor component which can be controlled by a field effect and has a multiplicity of parallel-connected individual components disposed in each case in cells, the cells are disposed tightly packed on a relatively small space in a cell array, the improvement includes:

a semiconductor body having a surface, including:

a) at least one inner zone of a first conductivity type bordering at least partially on the surface;

b) at least one drain zone bordering the at least one inner zone;

c) at least one base zone disposed in each of the cells and having a second conductivity type, the at least one base zone is embedded in the surface;

d) at least one source zone disposed in each of the cells and having the first conductivity type, the at least one source zone is embedded in the at least one base zone; and e) shadow regions are disposed in at least one of the at least one source zone of the cells, the shadow regions reduce an effective ratio of a channel width to the channel length;

at least one source electrode makes contact with the at least one base zone and the at least one source zone; and at least one gate electrode is disposed above and completely insulated from the semiconductor body.

According to the invention, the object is achieved by a semiconductor component of the type mentioned at the beginning which can be controlled by a field effect, by virtue of the fact that there are provided at least in one of the source zones of the cells shadowed regions which reduce the effective W/L ratio. The W/L ratio denoting the ratio of a channel width W to a channel length L.

The invention has the advantage that by providing shadowed regions inside the source zones which are preferably undoped or at least doped much more weakly than the source zones, the critical regions in the cell array with the highest current density are specifically moderated, and thus current filamentation is largely avoided.

The cell grid spacing $L_R$ of the cells in the cell array can be substantially reduced by this measure. For example, the cell structures can be implemented with a cell grid spacing $L_R$ of less than 20 µm. The below discussed advantages are achieved by providing shadowed regions and by increasing the cell density.

The cell grid spacing in the case of generic semiconductor components, in particular in the case of semiconductor components with depletion zones and complementary depletion zones, cannot be freely selected. The smaller the cell grid spacing, the larger the doping in the drift zone below the gate electrode has to be selected in order to avoid a lateral breakdown. It is true that the forward resistance becomes smaller, but owing to a tight cell grid spacing there is also a rise in the channel width per cell area, and thus in the saturation current. The provision of shadowed regions in the source zones reduces the effective channel width per cell area and avoids filamentation of the current in the drift zone.

Generic semiconductor components produced using trench technology typically have the regions of highest electric field strength at the trench bottom, and this leads to high loading of the gate oxide at this site. Although the reduction in the cell grid spacing minimizes the field peaks of the electric field, there is a consequent increase in the short-circuit current. To date, this has been solved by disposing so-called dead, that is to say inactive trenches between the gate electrodes, but this has led to a reduction in the cell density. The shadowed regions according to the invention reduce the short-circuit current in simultaneous conjunction with a high cell density.

In the case of so-called low-charge MOSFETs, it is necessary to reduce the gate-drain capacitance (feedback capacitance $C_{RSS}$). It is true that the tight cell grid spacing, that is to say a high cell density, reduces the area of the inner zone above the gate electrode, and thus the gate-drain capacitance (feedback capacitance $C_{RSS}$). However, a tight cell grid spacing is synonymous with a relatively large channel width per cell area, and thus with a relatively high saturation current. The shadowed regions according to the invention render it possible to set the saturation current density to a low value in simultaneous conjunction with a reduced gate-drain capacitance.

The shadowed regions are normally disposed in those regions of the source zone in which the formation of a current-carrying channel is to be suppressed or at least reduced.

The cell array of the power semiconductor component includes a multiplicity of typically similar, tightly packed cells. In this configuration, each of the cells usually contains in each case one source zone which is embedded in the base zone. It is, of course, also possible for an individual cell to have a plurality of base zones and/or a plurality of source zones. In the preferred exemplary embodiment, the cross-sectional surfaces of the base zone and the source zone in each case approximately take the shape of the cross-sectional surface of the corresponding total cell.

It is particularly advantageous when the cells of the cell array have a hexagonal cross-sectional surface. The hexagonal structure permits the densest surface packing of the cells, that is to say an optimum utilization of the chip area. However, with the hexagonal cell structure an optimum forward resistance is achieved in simultaneous conjunction with an optimum load current.

A further advantageous cell structure results if use is made of approximately square cells or rectangular or triangular cells. However, the invention can also be applied with other cell configurations such as, for example, round or oval cells.

The source zone is typically arsenic-doped. In order to be able to achieve a high load current in forward operation, it is necessary for the source zone to have a very high doping concentration of typically greater than $10^{18}$ cm$^{-3}$. It is particularly advantageous when the shadowed regions are undoped. In this case, the channel width is reduced in accordance with the width of the shadowed regions in the region of the pn junction between the source zones and the base zone. The consequence of the W/L ratio, thereby reduced, of the cell thus shadowed is that the current flow of the cell is likewise reduced.

It is, of course, also conceivable, although technically more complicated, for the shadowed regions to have a lower doping concentration than the source zone. In this case, the current flow in the shadowed regions of the source zone is reduced in accordance with the doping concentration. Since the case described above of the undoped shadowed regions is technically very difficult to implement, in the usual implementation, the shadowed regions mostly have the conductivity type and the doping concentration of the base zone.

By introducing shadowed regions in precisely one of the regions of the source zone with a minimum spacing from one another, the critical regions in which the maximum current density is to be expected can be specifically moderated. One of the two current channels injected from the source zones into the base zones is shadowed in each case by a three-bladed or propeller-like configuration of the shadowing mask, in particular with the hexagonal cell structure. At the same time, the partitioning of the channel current, and thus of the current resulting therefrom below the intercell zones is rendered largely homogeneous by a multipartite form of the mask. A substantially optimized, that is to say homogenized current density distribution in the current-carrying filament of the inner zone is thus ensured.

The source zones can be shadowed by up to 50% as a result of the three-bladed configuration of the shadowing mask. However, it is particularly advantageous when in each case individual active cells are provided which have no shadowed regions. With a hexagonal cell layout, the active cells are surrounded in each case by six inactive cells for which the respective source zones are typically completely shadowed. With this configuration of the cell layout, it is possible to achieve a shadowing of the source zones of up to 66%. Such semiconductor components have an improved short-circuit strength.

It is particularly advantageous when the drain zone has the same doping as the inner zone. The preferred semiconductor component resulting therefrom is then a power MOSFET. Typically, in the case of such power MOSFETs, the drain zone, which is usually formed by the bulk material of the semiconductor body, has a very much higher doping concentration than the inner zone. The inner zone or drift zone, which, as mentioned at the beginning, essentially determines the reverse voltage endurance, has typically been grown epitaxially. It is also conceivable for the inner zone to be constructed from a plurality of epitaxial layers that are sometimes also doped at different strengths. In this case, the reverse voltage can be set as desired by the number of the various epitaxial layers and by the doping concentration set in the inner zone.

However, the invention can also be applied to IGBTs and other power semiconductor components. In the case of the IGBTs, the drain zone is then constructed as an anode zone. The anode zone is of the opposite conductivity type to the inner zone and typically has a very high doping concentration.

The invention also has the advantage that by simply introducing, in particular along the current path, depletion zones and complementary depletion zones which are preferably paired in the case of vertical MOSFETs and IGBTs, an effective conductivity is ensured by the complementary depletion zones, on the one hand, and the regions deplete one another given an increase in the drain voltage, on the other hand, with the result that a high reverse voltage remains ensured. Since the total quantity of the doping in the depletion zones corresponds approximately to the total quantity of the doping in the complementary depletion zones, it is ensured that given an increase in the drain voltage, the pn regions thereby formed completely deplete one another, that is to say behave like a single insulator zone, as a result of which a high reverse voltage remains ensured.

Moreover, the invention can be applied to all types of MOSFET such as, for example, D-MOSFETs, V-MOSFETs, U-MOSFETs, etc.

Other features which are considered as characteristic for the invention are set forth in the appended claims.

Although the invention is illustrated and described herein as embodied in a semiconductor component which can be controlled by a field effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 2 is a plan view of a layout of a hexagonally constructed cell array of the semiconductor component having shadowed regions in accordance with FIG. 1;

FIG. 3 is a graph of a small signal characteristic (in reverse-biasing operation) of the semiconductor component provided with the shadowed regions, by comparison with a conventional semiconductor component without shadowed regions;

FIG. 4 is a partial sectional view for a vertical MOSFET produced using trench technology; and FIG. 5 is a plan view of a further hexagonally constructed cell array.

DESCRIPTION OF THE PREFERRED EMBODIMENTS

Figure 1:
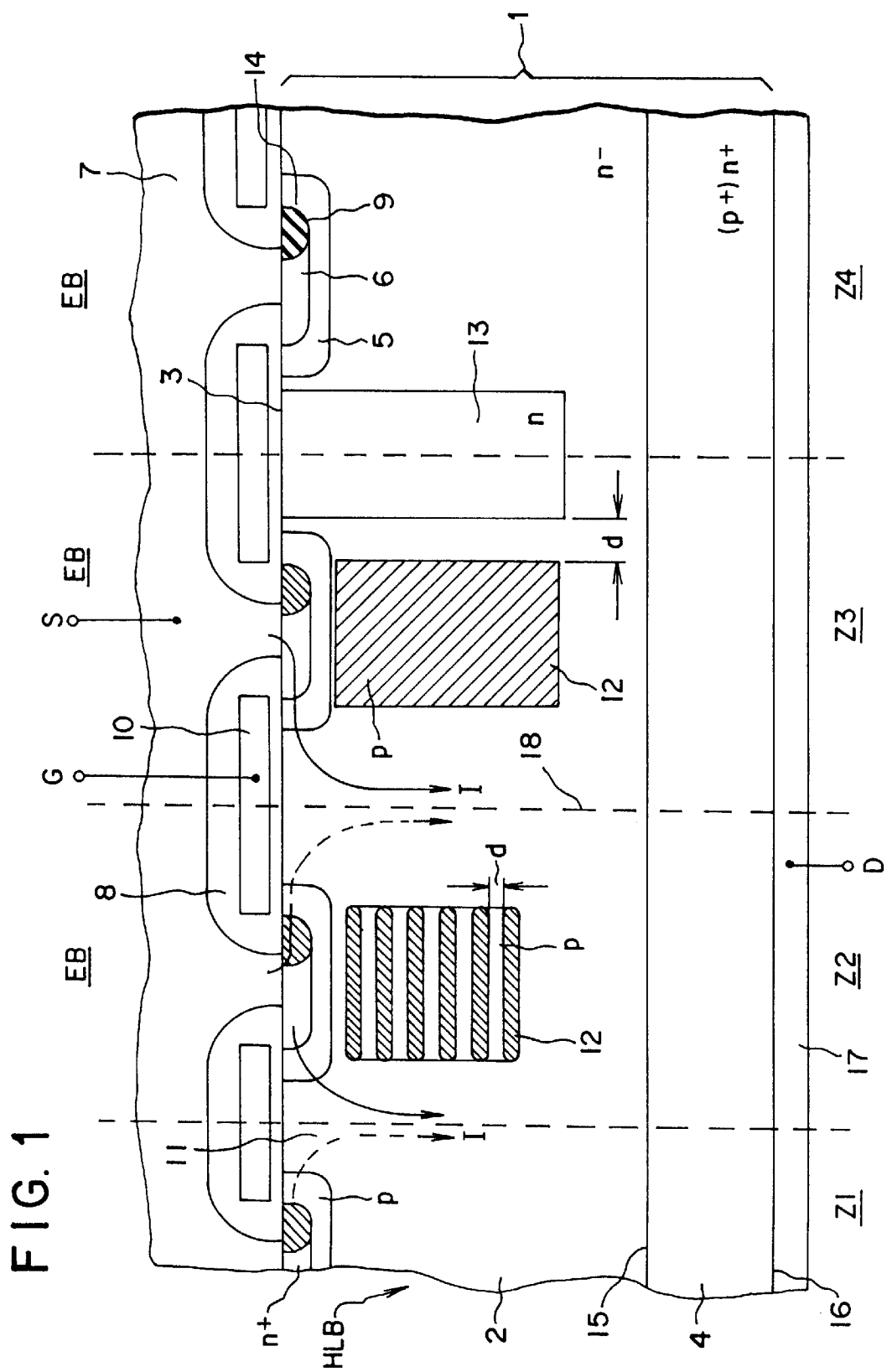
FIG. 1 is a partial sectional view of a vertically constructed semiconductor component that is constructed here as a D-MOSFET (or IGBT) according to the invention.

In all the figures of the drawing, sub-features and integral parts that correspond to one another bear the same reference symbol in each case. Referring now to the figures of the drawing in detail and first, particularly, to FIG. 1 thereof, there is shown a partial section of a vertically constructed power semiconductor component according to the invention, which is constructed here as a D-MOSFET (or IGBT) and is denoted by HLB. The power semiconductor component HLB has a multiplicity of parallel-connected individual components EB that are disposed in each case in individual cells. The partial section in FIG. 1 shows, by way of example, four cells Z1 . . . Z4 of the semiconductor component HLB.

The semiconductor body of the semiconductor component HLB is denoted by 1 in FIG. 1. The vertically constructed semiconductor component HLB has a source terminal S, a gate terminal G and a drain terminal D, the source terminal S and the drain terminal D are disposed on opposite sides of the semiconductor body 1.

The semiconductor body 1, which consists, for example, of a silicon substrate, has an inner zone 2, which is weakly n-doped in the present exemplary embodiment and has a first surface 3 of the semiconductor body 1 bordering with the source side. On the drain side, a drain zone 4 borders on the inner zone 2. The interface between the inner zone 2 and drain zone 4 is denoted here by 15.

If the semiconductor component HLB is constructed as a MOSFET, the drain zone 4 is typically strongly n-doped. If the semiconductor component HLB is an IGBT, the drain zone is also denoted as an anode zone and is strongly p-doped (as indicated in brackets), that is to say of the opposite type of conductivity to the inner zone 2. In this case, the interface 15 characterizes the pn junction between the drain zone 4 and the inner zone 2. Moreover, the drain zone 4 borders on a second surface 16 of the semiconductor body 1 and is connected here over a large area to the drain terminal D via a metallization or drain electrode 17.

On the source side, a multiplicity of base zones 5 are embedded on the first surface 3. The base zones 5 have a conductivity type opposite to the inner zone 2, that is to say they are p-doped in the case shown. In the present exemplary embodiment, the base zones 5 are of trough-shaped construction and can, for example, be produced by ion implantation or by diffusion. As the exemplary embodiment in FIG. 1 shows, each of the cells Z1 . . . Z4 typically, but not necessarily, has an individual base zone 5 in each case. Here, the base zones 5 have a cell structure corresponding to the cells Z1 . . . Z4. Such cell structures can be strip-shaped, hexagonal, triangular, quadrilateral, round, oval, etc.

In the present exemplary embodiment, a trough-shaped, strongly n-doped source zone 6 is embedded in each case in each of the base zones 5. However, it would also be conceivable for a plurality of source zones 6 to be embedded in each case in each of the base zones 5. It is, however, assumed below that each base zone 5 in each case contains only one source zone 6 which has, for example, been produced by arsenic implantation. The source zones 6 also have a cell structure like the cells Z1 . . . Z4. The source zones 6 and/or the base zones 5 can, however, also be constructed in the shape of a trench, in particular a V-trench. Such semiconductor components HLB are also denoted as trench MOSFETs or trench IGBTs, respectively.

The source zones 6 and the base zones 5 are connected in a known way to a source electrode 7 via a contact hole. The source electrode 7 is connected to the source terminal S. It would also be conceivable not to make contact between the base zones 5 and the source electrode 7. However, the shunting of the base zone 5 and the source zone 6 prevents parasitic bipolar transistors from being inadvertently inserted.

Disposed above the first surface 3 is a gate electrode 10 which is insulated via a thin gate oxide 8 from the semiconductor body 1 and the source electrode 7. The gate electrode 10, which is connected to the gate terminal G, can, for example, consist of highly doped polysilicon or of metal.

Neighboring base zones 5 of different cells Z1 . . . Z4 are separated spatially from one another via intercell zones 11.

Furthermore, depletion zones 12 and complementary depletion zones 13 can be provided in the inner zone 2. For the sake of clarity, the depletion zones 12 and the complementary depletion zones 13 are indicated in FIG. 1 only in two of the cells Z2, Z3. Moreover, the depletion zones 12 are represented in a hatched fashion, unlike the complementary depletion zones 13.

In cell Z2, the depletion zones and complementary depletion zones 12, 13 are constructed in an essentially horizontal fashion (build-up technique), while they are constructed in an essentially vertical fashion in cell Z3. The depletion zones and complementary depletion zones 12, 13 can be in contact with one another, that is to say they can be connected to one another, but they need not be connected to one another. If they are connected to one another, they form a pn junction.

All the depletion zones 12 shown are p-doped, and all the complementary depletion zones 13 shown are n-doped. The depletion zones 12 and complementary depletion zones 13 can be constructed in the form of layers, as indicated in cell Z2, or in the form of threads or strips, as indicated in cell Z3. However, it would be conceivable for the depletion zones and complementary depletion zones 12, 13 to be constructed essentially spherically. In the present exemplary embodiment, depletion zones and complementary depletion zones 12, 13 are essentially located below the region of the base zone 5. Of course, it would also be conceivable for the depletion zones and complementary depletion zones 12, 13 to be disposed exclusively in the regions below intercell zones 11 or in the entire inner zone 2 or in each case partly below the intercell zones 11 and the base zones 5.

What is essential here is that the total quantity of the doping of the depletion zones 12 corresponds approximately to the total quantity of the doping of the complementary depletion zones 13, that is to say the depletion zones 12 and complementary depletion zones 13, which are preferably disposed in pairs, behave like a single insulator zone, as a result of which a high reverse voltage is ensured. It is to be noted furthermore, that the sum of the volumetric expansions of the introduced depletion zones 12 is approximately equal to or at least smaller than that of the complementary depletion zones 13.

For the case in which the depletion zones 12 and the complementary depletion zones 13 are spaced apart from one another as in cell Z3, a spacing d between in each case two depletion zones and complementary depletion zones 13 disposed in pairs should preferably be smaller than a width of a space-charge zone between the complementary depletion zones 13 and depletion zones 12 in the case of a breakdown voltage between the neighboring depletion zones 12 and complementary depletion zones 13. The spacing d is preferably also to be selected as 0.

The depletion zones 12 shown in cells Z2 and Z3 are configured in a floating fashion and therefore fill up only a portion of the inner zones 2. However, this is not a necessary requirement. In the case where the depletion zones 12 are configured in a non-floating fashion, they are connected at least partially to one of the interfaces with a defined potential, for example to the interface 15 and/or the base zone 5. In contrast, the complementary depletion zone 13 shown in cell Z3 is not configured in a floating fashion, that is to say it is connected to the first surface 3 of the semiconductor body 1.

The mode of operation of the structures shown in FIG. 1 is explained in more detail below.

In the case of a small drain voltage, the conductivity in the inner zone 2 is sufficiently high, since the complementary depletion zones 13 are constructed with low resistance. If the drain voltage is continuously increased, at a moderate reverse voltage (for example less than 30 volts), the depletion zones 12 and complementary depletion zones 13 deplete one another. In the case of a further increase in voltage, the vertical electric field is now likewise intensified. The reverse voltage is then taken up by the inner zone 2.

The precise function as well as the structure and the production of such depletion zones 12 and complementary depletion zones 13 are described in detail in the previously mentioned documents International Patent Application WO 97/29518 and U.S. Pat. No. 4,754,310, and are hereby expressly incorporated by reference into the subject-matter of the present invention.

According to the invention, shadowed regions 9 are provided in the source zones 6 in FIG. 1. The shadowed regions 9 inside the source zones 6 are represented in each case in a hatched fashion. The shadowed regions 9 occupy a portion of the source zones 6. The shadowed regions 9 are typically undoped, but can also have a weak doping concentration of the same conductivity type as the source zones 6. However, for technical reasons the shadowed regions 9 usually have the same conductivity type and the same doping concentration as the base zones 5.

The shadowed regions 9 are preferably disposed in the edge regions of the source zone 6, and border in the regions at least laterally on the pn junction 14 between the base zone 5 and source zone 6. The configuration of the shadowed regions 9 inside the source zones 6 is essential for their functioning in this case.

The precise structure and form of the shadowed regions 9 and their configuration inside the cell array is explained below with the aid of FIG. 2. FIG. 2 shows a plan view of the layout of the cell array of the semiconductor component HLB with shadowed regions 9 provided in accordance with the invention. Elements that are the same or functionally the same are provided in FIG. 2 with the same reference symbols.

The cell array in FIG. 2 is denoted by ZF. The cell array ZF has a hexagonal cell structure with a multiplicity of hexagonally constructed cells of which some cells Z1 . . . Z6 are provided with reference symbols by way of example.

The use of hexagonal cells Z1 . . . Z4, however, proves to be particularly advantageous, since in contrast with other cell structures, for example triangular or quadratic cells, it exhibits a more effective tiling of the surface or an optimum surface packing.

The plan view of the cell array ZF specifically marks the (implantation) mask for producing the source zones 6 with the shadowed regions 9 according to the invention. In this case, 6a denotes the regions provided for the source zone implantation (represented in a hatched fashion in cell Z6). Here, the regions 6a provided for the source zones 6 have, but not necessarily, the same hexagonal cell structure as the cells Z1 . . . Z6 of the cell array ZF.

Moreover, the regions for producing the shadowed regions 9 are denoted by 9a in the implantation mask (represented in a hatched fashion in cell Z2). The regions 9a have a three-bladed or propeller-like configuration. The shape and area of the source zone regions thus "shadowed" essentially determine the W/L ratio in the respective cell, W denoting a channel width and L a channel length.

The mode of operation of the semiconductor components HLB according to the invention and having the shadowed regions 9 is explained below with the aid of FIGS. 1 and 2.

If a positive gate potential is applied to the gate terminal G, a channel 14 is formed in the base zone 5 below the gate electrode 10 between the source zone 6 and inner zone 2. A positive drain potential at the drain terminal D then leads to the formation of a current channel in the channel zone 14, that is to say in the regions of the base zones 5 covered by the gate electrode 10. The semiconductor component HLB thus switches through, and a current flow, running initially in essence horizontally, of majority charge carriers (electrons) is set up from the source zone 6 via the current channel 14 to the intercell zone 11.

The current is then extracted from an intercell zone 11 in a fashion running essentially vertically by the drain zone 4. A current filament is then formed in this current-carrying region of the inner zone 2, which is located below the intercell zones 11. This filamentary current is denoted in FIG. 1 by I.

The density of the filamentary current is, however, not distributed homogeneously here, since the current components of respectively neighboring cells are added to the respective total current density. In particular, the current density is highest immediately in the region of an interface 18 between two neighboring cells.

Neighboring cells also have source subregions 6b (represented in a hatched fashion in cells Z1 and Z3 of FIG. 2), in which the corresponding source zones 6 have a minimum spacing $d_{min}$ from one another. The highest current densities then occur between the source subregions 6b, specifically precisely in the middle dmin/2 between the two source subregions 6b. The region is subsequently denoted as a critical region 19. The critical regions 19 of the cell Z4 are marked in a hatched fashion at their interfaces 18.

The semiconductor component HLB ought therefore to be dimensioned such that the critical current density $J_{crit}$ is not exceeded in the critical region 19, although, because of the inhomogeneous current density distribution, the current density in the regions outside the critical region 19 is sometimes far below the critical current density $J_{crit}$.

As already mentioned, the source zones 6 of two neighboring cells have source subregions 6b with minimum spacing $d_{min}$ of the source zones 6. By introducing the shadowed regions 9 in the case of precisely one of the two source subregions 6b, the critical regions 19 can then be specifically moderated. This state of affairs is illustrated in FIG. 1. There, the shadowed regions 9 are disposed in each case only in the right-hand portion of the source zones 6, while the left-hand regions of the source zones 6 are respectively free from shadowed regions 9.

Owing to the fact that selected source subregions 6b have been fitted with shadowed regions 9, the critical regions 19 with the highest current density can be specifically moderated. This is also made clear in FIG. 1. There, the continuous arrow denotes the "non-shadowed" current component, while the dashed arrow denotes the "shadowed" current component. By contrast with the non-shadowed current component, the shadowed current component has a substantially reduced current intensity, which can even be 0 in the extreme case.

A particular result of this measure is the moderation of the critical current densities in the critical region 18 between two neighboring cells. Thus, an essentially optimized, that is to say homogenized current density distribution is ensured in the current-carrying filament of the inner zone 2.

In the exemplary embodiment in accordance with FIG. 2, the regions 9a provided for the shadowing have a three-bladed configuration. However, the configuration can also be selected such that in each case larger or smaller regions 9a of the source zones 6 are shadowed. All that is essential for the invention is that the source regions 6a provided for the $n^+$-source implantation are shadowed in each cell in such a way that the effective W/L ratio per cell is reduced. The three-bladed configuration thus emerges as particularly advantageous as a consequence of its symmetrical configuration in the cell array.

One of the two current channels injected from the source zones 6 into the base zones 5 is respectively shadowed by the three-bladed configuration of the mask for the shadowed regions 9. At the same time, the frequency of the channel current and thus of the total current resulting therefrom below the intercell zones 11 assumes a largely homogeneous configuration owing to a multipartite form of the mask.

The channel width W is reduced and/or the channel length L is increased in each cell by the structured shadowing of each cell. In both instances, the W/L ratio is reduced in the shadowed cell, and thus also is the shadowed current component.

If the shadowed regions 9 are undoped, no channel zone 14 forms in the shadowed regions 9 of the source zone 6, that is to say the effective channel width W of the shadowed cell is reduced.

For the case in which the shadowed regions 9 do have the same, although (substantially) lower doping concentration of the same conductivity type as the source zone 6, a current channel 14 is indeed injected, but a (much) lower current flows. Therefore, the "effective" channel width W participating in the current flow is likewise smaller.

However, by contrast with weakly doped shadowed regions 9, undoped shadowed regions 9 prove to be more advantageous, since it is possible to save at least one step in the technology when producing them. In both instances, the structured shadowing of the n$^+$-implanted source zones 6 reduces the effective channel width W per cell in each cell, since no electron source, or a reduced one, is available in the shadowed region for the electron current.

It is therefore possible, by setting the doping concentration of the shadowed regions 9 and through their configuration and geometry, for the (effective) W/L ratio, and thus the shadowed current component, to be reduced in a defined fashion at this site.

The essential advantage of the structured shadowing of the source zones 6 according to the invention consists in that, it is possible to achieve a rectangular, so-called safe operating area, in particular in the case of MOS semiconductor components HLB which have depletion zones 12 or complementary depletion zones 13 in accordance with FIG. 1. That is to say despite a drastically reduced chip area and given an unchanged forward resistance RDS$_{on}$ per unit area. The current density in the safe operating area is distributed optimally and is substantially below the maximum permissible critical current density J$_{crit}$.

Furthermore, the short-circuit current can be limited to a very low level. Consequently, the robustness of the MOS semiconductor components HLB can be raised, that is to say it is possible to realize a drastically reduced chip area given the same requirements placed on the forward resistance RDS$_{on}$ per unit area and an unchanged nominal current. It is thereby possible to implement cell structures with a cell grid spacing Z$_R$ of less than 20 $\mu$m. Correspondingly substantial cost advantages are achieved in this way.

FIG. 3 shows the small-signal characteristic diagram (in reverse-biasing operation) of the semiconductor component (1) provided with shadowed regions, by comparison with a conventional semiconductor component without shadowed regions (2). The components there are constructed in each case for a reverse voltage of 600 V, and have the same doping concentrations in the individual layers, as well as an equivalent cell layout. The abscissa in FIG. 3 shows the drain-source voltage VDS in the case of reverse-biasing, while the ordinate shows the drain current ID (small signal) for different gate-source voltages VGS (VGS=10V/12V/14V) of the semiconductor components. It is clear that the shadowed semiconductor components can be operated up to a reverse voltage of 500 V without an appreciable rise in the drain current. By contrast therewith, the conventional semiconductor components show a very steep rise in the drain current.

Particularly in the case of low reverse voltages, for example approximately 100 V in FIG. 3, the shadowed semiconductor components have a very much lower drain current than the conventional semiconductor components. However, given an increasing gate-source voltage VGS, the drain current can be increased up to when saturation is reached. The semiconductor components according to the invention can advantageously be controlled into the current regions of conventional semiconductor components, but without the formation of current filaments.

A vertical D-MOSFET is specified in the exemplary embodiment of FIG. 1. However, the invention can be applied to virtually all MOSFETs of vertical and lateral configuration and to IGBTs. Use with bipolar semiconductor components would also be conceivable.

FIG. 4 shows a preferred exemplary embodiment for a vertical MOSFET produced using trench technology. Identical or functionally identical elements are provided in accordance with FIGS. 1 and 2, with identical reference symbols. For the purpose of a better overview, FIG. 4 contains only the features relevant for describing the function of the semiconductor component.

In contrast to FIG. 1, a gate electrode 8 is disposed here in a trench 20 and projects like a pin into the semiconductor body 1. The shape of the gate electrode 8 can be of differing configuration in the trenches 20. They can expand in the shape of a bottle into the depth of the trench 20, or they can be constructed as a V-shaped trench.

In a manner similar to FIG. 1, the semiconductor component HLB in FIG. 4 also has the shadowed regions 9 inside the source zones 6. In this configuration, the source zones 6 can be partially shadowed, that is to say the shadowed regions 9 cover only a portion of the source zones 6. This is indicated in cells Z2 and Z3. However, it would also be conceivable for the source zones 6 to be completely shadowed, as in cell Z4. It would also be conceivable for some cells to be completely free of shadowed regions 9 (not shown in FIG. 4).

The configuration of the shadowed regions 9 in FIG. 2 is symmetrical, it being the case that, particularly owing to the three-bladed configuration of the shadowing mask, an approximately equally large surface of the source zones 6 is provided with shadowed regions 9 for each cell. Depending on the configuration of the mask for the shadowed regions, it is possible here to achieve a reduction in the active current-carrying surface of the semiconductor component HLB, and thus a shadowing of up to 50%.

FIG. 5 shows in a plan view a schematic sketch of a further hexagonally constructed cell array ZF, in which a higher degree of shadowing can be achieved. Identical or functionally identical elements are provided in accordance with FIG. 2 with identical reference symbols.

The cell array in FIG. 5 is constructed in accordance with the cell array in FIG. 2, and has a multiplicity of hexagonally constructed cells Z', Z", which are likewise disposed here in the tightest surface packing. The cells Z', Z" in the cell array ZF are only indicated in the schematic sketch in FIG. 5.

By contrast with the example in FIG. 2, however, provided in FIG. 5 in each case are individual active cells Z' in which no shadowed regions are provided in the source zone. In the hexagonal, most closely packed cell layout, one cell of the cell array is surrounded in each case respectively by six cells with the shortest spacing. In this case, the active cells Z' are surrounded in the exemplary embodiment of FIG. 5 by in each case six inactive cells Z", in which the respective source zones are typically completely shadowed. The cells are represented in a hatched fashion in FIG. 5. It is therefore possible to achieve a shadowing of the source zones of up to 66% with this configuration of the cell layout. Such semiconductor components HLB have an improved short-circuit strength.

The exemplary embodiments in FIGS. 1, 2 and 4 describe in each case a hexagonal cell layout that is, as described above, particularly advantageous for geometrical reasons. Of course, the invention is not limited exclusively to a hexagonal cell array layout, but can also very advantageously be extended to a cell array layout with square, triangular, rectangular, polygonal etc. cells, as well. A cell layout with round or oval cells would also be conceivable. In any case, a propeller-like configuration of the shadowed regions 9—with a configuration adapted depending on cell structure—is particularly advantageous.

We claim:

1. In an improved power semiconductor component which can be controlled by a field effect and has a multiplicity of parallel-connected individual components disposed in each case in cells, the cells disposed tightly packed on a relatively small space in a cell array, the improvement comprising:

a semiconductor body having a surface, including:
- a) at least one inner zone of a first conductivity type bordering at least partially on said surface, said at least one inner zone having at least one depletion zone of a second conductivity type and at least one complementary depletion zone having said first conductivity type a total quantity of doping of said at least one depletion zone corresponding approximately to a total quantity of doping of said at least one complementary depletion zone;
- b) at least one drain zone bordering said at least one inner zone;
- c) at least one base zone disposed in each of the cells and having a second conductivity type, said at least one base zone embedded in said surface;
- d) at least one source zone disposed in each of the cells and having said first conductivity type, said at least one source zone embedded in said at least one base zone; and
- e) shadow regions disposed in at least one of said at least one source zone of the cells, said shadow regions reducing an effective ratio of a channel width to a channel length;

at least one source electrode making contact with said at least one base zone and said at least one source zone; and at least one gate electrode disposed above and completely insulated from said semiconductor body.

2. The power semiconductor component according to claim 1, wherein source zones of two neighboring cells have source subregions with a minimum spacing $d_{min}$ between said source zones, one of said source subregions in each case having said shadowed regions.

3. The power semiconductor component according to claim 1, wherein said shadowed regions have a same conductivity type as said at least one source zone and have a lower doping concentration than said at least one source zone.

4. The power semiconductor component according to claim 1, wherein said shadowed regions are undoped.

5. The power semiconductor component according to claim 1, wherein at least one of said at least one source zone and said shadowed regions are arsenic-doped.

6. The power semiconductor component according to claim 1, wherein each of the cells has precisely one of said at least one base zone and at least one of said at least one source zone, said one base zone and said at least one source zone disposed approximately concentrically about a midpoint of a respective cell and have cross-sectional surfaces corresponding approximately to a cross-sectional surface of the respective cell.

7. The power semiconductor component according to claim 1, wherein the cells in the cell array are substantially hexagonal-shaped cells.

8. The power semiconductor component according to claim 1, wherein the cells in the cell array are substantially square-shaped cells.

9. The power semiconductor component according to claim 1, wherein said shadowed regions have a substantially propeller shape and are disposed inside a cell in a plane of said surface.

10. The power semiconductor component according to claim 1, wherein each of said at least one source zone of the cells of the cell array has shadowed regions.

11. The power semiconductor component according to claim 1, wherein the cell array has a cell grid spacing smaller than 20 uM.

12. The power semiconductor component according to claim 1, wherein said at least one drain zone has a doping of said first conductivity type.

13. The power semiconductor component according to claim 1, wherein said at least one drain zone has a substantially higher doping concentration than said at least one inner zone.

14. The power semiconductor component according to claim 1, wherein said at least one inner zone is grown at least partially epitaxially.

15. The power semiconductor component according to claim 1, wherein the cell array has a plurality of at least partially inactive cells and a multiplicity of active cells free of said shadowed regions, said multiplicity of active cells surrounded at least partially by said plurality of said at least partially inactive cells, said plurality of said at least partially inactive cells having said shadowed regions.

* * * * *